US009191076B2

(12) United States Patent
Winget et al.

(10) Patent No.: US 9,191,076 B2
(45) Date of Patent: Nov. 17, 2015

(54) ASSEMBLY HAVING A SUPPORT SURFACE CAPABLE OF SIMULTANEOUSLY SUPPORTING AND WIRELESSLY SUPPLYING ELECTRICAL POWER TO A PORTABLE ELECTRONIC DEVICE SUPPORTED ON THE SUPPORT SURFACE

(71) Applicant: Global IP Holdings, LLC, Sterling Heights, MI (US)

(72) Inventors: Larry J. Winget, Leonard, MI (US); Darius J. Preisler, Macomb, MI (US); Christopher A. Heikkila, Washington Township, MI (US)

(73) Assignee: GLOBAL IP HOLDINGS, LLC, Sterling Heights, MI (US)

( * ) Notice: Subject to any disclaimer, the term of this patent is extended or adjusted under 35 U.S.C. 154(b) by 347 days.

(21) Appl. No.: 13/832,124

(22) Filed: Mar. 15, 2013

(65) Prior Publication Data

US 2013/0257170 A1 Oct. 3, 2013

Related U.S. Application Data

(63) Continuation-in-part of application No. 13/438,335, filed on Apr. 3, 2012.

(51) Int. Cl.
*H04B 5/00* (2006.01)
*H04B 1/3816* (2015.01)
*H04B 1/3822* (2015.01)

(52) U.S. Cl.
CPC ............ *H04B 5/0037* (2013.01); *H04B 1/3816* (2013.01); *H04B 1/3822* (2013.01)

(58) Field of Classification Search
CPC .......... H02J 7/025; B60R 1/00; H04B 5/0037
USPC ........................... 307/104, 9.1, 10.1; 439/626
See application file for complete search history.

(56) References Cited

U.S. PATENT DOCUMENTS

| 3,205,618 A | 9/1965 | Heytow |
| 3,978,934 A | 9/1976 | Schneidinger |
| 4,324,301 A | 4/1982 | Eyerly |
| 5,868,076 A | 2/1999 | Myus et al. |
| 5,977,489 A | 11/1999 | Crotzer et al. |

(Continued)

OTHER PUBLICATIONS

Office Action; corresponding U.S. Appl. No. 13/438,335; notification date Mar. 20, 2015.

(Continued)

*Primary Examiner* — Jared Fureman
*Assistant Examiner* — James P Evans
(74) *Attorney, Agent, or Firm* — Brooks Kushman P.C.

(57) ABSTRACT

An assembly having a support surface capable of simultaneously supporting and wirelessly supplying electrical power to a portable electronic device supported on the support surface is provided. The assembly includes first and second members each of which is formed as a unitary molded part from at least one plastic formulated with an electrically conductive filler in a molding process. The members are assembled together so that a first set of surface portions of the first member are spaced apart and electrically isolated from a second set of surface portions of the second member to at least partially define the support surface and to allow the first and second sets of surface portions to be biased at first and second different voltage levels, respectively, at the same time to allow the wireless power transfer.

20 Claims, 7 Drawing Sheets

(56) References Cited

U.S. PATENT DOCUMENTS

| | | | |
|---|---|---|---|
| 6,044,767 A | 4/2000 | Myus et al. |
| 6,180,221 B1 | 1/2001 | Crotzer et al. |
| 6,396,925 B1 | 5/2002 | Close |
| 6,475,937 B1 | 11/2002 | Preisler et al. |
| 6,539,358 B1 | 3/2003 | Coon et al. |
| 6,827,318 B1 | 12/2004 | Hsu Li |
| 6,917,182 B2 | 7/2005 | Burton et al. |
| 7,065,658 B1 | 6/2006 | Baraban et al. |
| 7,116,215 B2 | 10/2006 | Oonishi |
| 7,172,196 B2 | 2/2007 | Randall |
| 7,272,984 B2 | 9/2007 | Fan |
| 7,399,202 B2 | 7/2008 | Dayan et al. |
| 7,654,683 B2 | 2/2010 | Ellis |
| 7,868,585 B2 | 1/2011 | Sarnowsky et al. |
| 7,932,638 B2 | 4/2011 | Randall |
| 7,952,320 B2 | 5/2011 | Bersenev |
| 7,982,436 B2 | 7/2011 | Randall |
| 7,986,059 B2 | 7/2011 | Randall |
| 8,081,408 B2 | 12/2011 | Randall |
| 8,145,821 B2 | 3/2012 | Mead et al. |
| 8,235,826 B2 | 8/2012 | Randall |
| 2003/0013500 A1 | 1/2003 | Dunoff et al. |
| 2005/0162133 A1 | 7/2005 | Aisenbrey |
| 2006/0066088 A1 | 3/2006 | Hier et al. |
| 2006/0278788 A1 | 12/2006 | Fan |
| 2008/0019082 A1 | 1/2008 | Krieger et al. |
| 2010/0156197 A1 | 6/2010 | Randall |
| 2011/0006611 A1 | 1/2011 | Baarman et al. |
| 2011/0084655 A1 | 4/2011 | Hui et al. |
| 2011/0128686 A1 | 6/2011 | Moreshead |
| 2011/0227527 A1 | 9/2011 | Zhu et al. |
| 2011/0241608 A1 | 10/2011 | Adamczyk et al. |
| 2013/0333941 A1* | 12/2013 | Snider ............ 174/535 |

OTHER PUBLICATIONS

Office Action; corresponding U.S. Appl. No. 13/526,855; notification date Mar. 27, 2015.

Office Action; corresponding U.S. Appl. No. 14/050,513; notification date Apr. 14, 2015.

* cited by examiner

From Power Source

ASSEMBLY HAVING A SUPPORT SURFACE CAPABLE OF SIMULTANEOUSLY SUPPORTING AND WIRELESSLY SUPPLYING ELECTRICAL POWER TO A PORTABLE ELECTRONIC DEVICE SUPPORTED ON THE SUPPORT SURFACE

CROSS-REFERENCE TO RELATED APPLICATION

This application is a continuation-in-part of U.S. application Ser. No. 13/438,335 filed Apr. 3, 2012.

TECHNICAL FIELD

This invention relates, in general, to part assemblies having support surfaces capable of wirelessly supplying electrical power and, in particular, to part assemblies having support surfaces capable of wirelessly supplying electrical power to portable or mobile electrically-powered electronic devices supported on the support surfaces.

OVERVIEW

Plastic parts such as automotive interior plastic parts must satisfy a wide variety of environmental and safety regulations including the need for such parts to be recyclable. Because of the potentially large volume of automotive vehicles that are produced year after year, automotive interior parts must be produced in a cost-effective fashion without the need for elaborate and costly manufacturing facilities.

The proliferation of portable or mobile, re-chargeable battery powered electronic devices of many types and varieties is virtually boundless, due in large part to better and smaller rechargeable batteries, wireless communications and data transfer capabilities, and other capabilities and features that have made such electronic devices convenient and affordable. Consequently, many people have and use not just one, but a number of different electronic devices, for example, mobile phones (in FIG. 2), music players, notebook computers, laptop computers, personal digital assistants, cameras, GPS position locators, hearing aids, flash lights, and many others, all of which need to be recharged from time to time.

Power supply pads with power supply contact surfaces on which a variety of such electronic devices equipped with conduction contacts can be positioned alone or along with others to receive recharging power wirelessly or in a wire-free manner, i.e., without wires or plugs between the power supply surfaces of the power delivery pads or contacts and the power receiver contacts on the mobile electronic or electrically-powered electronic devices.

There are a number of problems affecting the passage of current between contact surfaces such as:
surface finish; wear; arc erosion; contamination; oxidation; silicone contamination; frettage and frottage corrosion; and contact bounce.

Many of the above-noted problems result in a reduction in electrical contact area which increases electrical resistance and results in much higher operating temperatures at the contact surfaces causing inefficient operation and damage to the contacts themselves.

An uneven contact surface will wear on the contact areas. Debris from abrasion and erosion will collect in any cavity in the contact areas, oxidize, and further reduce contact surface area and increase abrasion.

An attribute of some of the wire-free conductive power delivery systems includes combinations of power delivery pad configurations and power receiver contact configurations that ensure wire-free power transfer from the power pads to the electronic devices, regardless of the location or orientation at which the mobile electronic device with its power receiver contacts may be positioned on the power delivery pad. For example, for a power delivery pad with an array of square power surfaces, each one being opposite in polarity to each laterally adjacent power surface, a power receiver contact configuration or constellation comprising at least five contacts equally spaced in a circle (pentagon configuration) of appropriate size in relation to the square power surfaces.

In another example, for a power delivery pad with an array of elongated, parallel power surfaces or strips, each one of which is opposite in polarity to each adjacent strip, a power receiver contact configuration or constellation comprising at least four contacts, three of which are at points of an equilateral triangle and the fourth of which is at the center of the equilateral triangle of appropriate size in relation to the elongated rectangular power surfaces, can ensure power transfer, regardless of location or orientation of the constellation of power receiver contacts on the power delivery pad.

An example prior art charging pad and enabled power receiving device are shown in FIG. 2. The charging pad transfers power wirelessly or wire-free, i.e., without a charging adapter cord, to one or more devices resting on it. In this context, the terms "wireless", "wirelessly", and "wire-free" are used to indicate that charging of the device is achieved without a cord-type electric charging unit or adapter, and in the example of FIG. 2, is achieved with through electrical conduction through contacts with selective geometry. Wireless in this context can be interfacing contacts as will be explained below. Also, the term "enabled" device is used for convenience to mean an electronic or electrically powered device, for example, cell phone, computer, radio, camera, personal digital assistant, digital recorder and playback device, hearing aid, GPS receiver or transmitter, medical instrument, or just about any other portable device, that is equipped with charging contacts and associated electronic circuitry to enable the device to be electrically charged by the power pad component.

The top surface of the charging pad may comprise an array of contact strips which are energized with low voltage DC or AC or grounded so that every other strip is at a different voltage, e.g., one set of strips are positive and the strips in-between the positive strips are negative or ground potential, or vice versa.

On the underside of one example enabled device there are a plurality of conduction contact points arranged in a "constellation" configuration or pattern. One example constellation pattern comprises four contacts arranged with three of the contacts defining the vertices of an equilateral triangle and the fourth contact in the middle of the equilateral triangle. This pattern is sometimes referred to as a tetrahedron pattern because the four contacts are positioned as the vertices of a tetrahedron would appear in a top plan view of a tetrahedron.

The contact constellation on the enabled device of FIG. 2 and the contact strip array on the charging pad form a geometrically complementary pair with the property that electrical power can be transferred from the pad into the device regardless of the position and orientation of each particular device on the pad. The particular number, geometric size, and arrangement of the contacts is not the subject of this invention. Suffice it to say that they can be sized, arranged, and shaped to transfer power from the power delivery surface of the charging pad to an enabled charge receiving device.

With appropriate sizing, no matter where or at which orientation the constellation is set on the pad, at least one positive and one negative contact will be made, thus electrical power can be transferred from the pad to the enabled device. Power can be extracted from the contacts using a rectifier, the output of which is approximately equal to the electrical potential between contract strips or pads of the power delivery surface after allowing for some losses in the rectifier circuit. The rectifier can be a bridge rectifier enabled with diodes (not shown) that also inherently prevents the exposed contacts on the mobile or enabled device from being "live" when they are separated or removed from the charging pad. In other words, the diodes in the rectifier between the contacts on the enabled device and the rechargeable battery or capacitor in the enabled device prevents electric current from flowing from the rechargeable battery or capacitor of the device to the contacts.

In this architecture, the voltage on the power delivery surface of the charging pad is fixed and independent of the devices resting on the pad surface. Each individual device that gets positioned on the charging pad is responsible for conditioning the electric power obtained from the charging pad to power that is appropriate for its own use. This scheme inherently allows for multiple devices of various manufacturers with various power requirements to be charged from the same charging pad.

The following prior art U.S. patent documents are related to the present invention: U.S. Pat. Nos. 6,917,182; 7,065,658; 7,399,202; 7,654,683; 7,952,320; 7,986,059; 2005/0162133; 2010/0156197; 2011/0084655; 2011/0128686; 2011/0227527; and 2011/0241608.

There are a number of problems associated with the above-noted prior art especially if the disclosed power pads are to be used in an automotive interior environment. For example, automotive interior parts can experience wide temperature swings, and are subject to shock and vibration not normally experienced in a controlled home or office environment. Also, objects supported on generally horizontal support surfaces of automotive interior parts experienced various forces (i.e., acceleration, deceleration and/or centrifugal) which urge the objects to shift, slide or roll on the support surfaces in response to the motion of the vehicle.

SUMMARY OF EXAMPLE EMBODIMENTS

An object of at least one embodiment of the present invention is to provide an assembly having a support surface capable of simultaneously supporting and wirelessly supplying electrical power to a portable electric device supported on the support surface wherein parts of the assembly are easily and inexpensively molded from at least one plastic formulated with an electrically conductive filler.

In carrying out the above object and other objects of at least one embodiment of the invention, an assembly having a support surface capable of simultaneously supporting and wirelessly supplying electrical power to a portable electronic device supported on the support surface is provided. The assembly includes a first member formed as a unitary molded part from at least one plastic formulated with an electrically conductive first filler in a molding process. The first member includes a first base portion and a first set of surface portions which partially define the support surface and bonded to the first base portion. Each of the first set of surface portions includes particles of the first filler dispersed therein in a concentration sufficient to provide a substantially continuous conductive path in the first member. The assembly also includes a second member formed as a unitary molded part from at least one plastic formulated with electrically conductive second filler in a molding process. The second member includes a second base portion and a second set of surface portions which partially define the support surface and bonded to the second base portion. Each of the second set of surface portions includes particles of the second filler dispersed therein in a concentration sufficient to provide a substantially continuous conductive path in the second member. The members are assembled together so that the first set of surface portions are spaced apart and electrically isolated from the second set of surface portions to allow the first and second sets of surface portions to be biased at first and second different voltage levels, respectively, at the same time. The first and second sets of surface portions allow wireless power transfer to a portable electronic device supported on the support surface.

The assembly may include a third member formed as a unitary molded part from an insulating material in a molding process. The third member may be positioned between and electrically insulate the first and second sets of surface portions from each other.

The insulating material may be a thermoplastic.

The third member may partially define the support surface.

The assembly may further include a power source coupling located between the first and second members and the third member. The coupling may include a first conductive power member electrically coupled to each of the first set of surface portions and a second conductive power member electrically coupled to each of the second set of surface portions. The first and second conductive power members may form respective conductive pathways and are operable for biasing the first and second sets of surface portions at the first and second voltage levels, respectively.

Each of the power members may include a planar interdigitated electrode wherein the assembly has a sandwich structure.

The first and second sets of surface portions may be sized, shaped and arranged laterally adjacent to each other in a pattern at the support surface in relation to a predetermined distribution of contacts on the device to achieve wireless conductive power transfer to the device in various positions and orientations of the device when supported on the support surface.

The first set of surface portions may include a common spine portion for electrically coupling the rest of the first set of surface portions together.

The first member may be comb-shaped.

The second set of surface portions may include a common spine portion for electrically coupling the rest of the second set of surface portions together.

The second member may be comb-shaped.

The members may be substantially co-planar.

The first set of surface portions may include a first plurality of finger portions and the second set of surface portions may include a second plurality of finger portions wherein the first and second plurality of finger portions are interdigitated.

The first and second sets of surface portions may be anti-vibration and anti-shock surface portions and the third member may include anti-vibration and anti-shock surface portions to dampen shock and vibration at the support surface.

The base portions may be electrically non-conductive relative to their respective sets of surface portions.

The first and second members may have substantially the same size and shape.

The first and second members may be formed from substantially the same plastic in a single injection-molding process.

The assembly may be used within the interior of a vehicle such as an automotive vehicle.

Other technical advantages will be readily apparent to one skilled in the art from the following figures, descriptions and claims. Moreover, while specific advantages have been enumerated, various embodiments may include all, some or none of the enumerated advantages.

DETAILED DESCRIPTION

As required, detailed embodiments of the present invention are disclosed herein; however, it is to be understood that the disclosed embodiments are merely exemplary of the invention that may be embodied in various and alternative forms. The figures are not necessarily to scale; some features may be exaggerated or minimized to show details of particular components. Therefore, specific structural and functional details disclosed herein are not to be interpreted as limiting, but merely as a representative basis for teaching one skilled in the art to variously employ the present invention.

Figure 1:
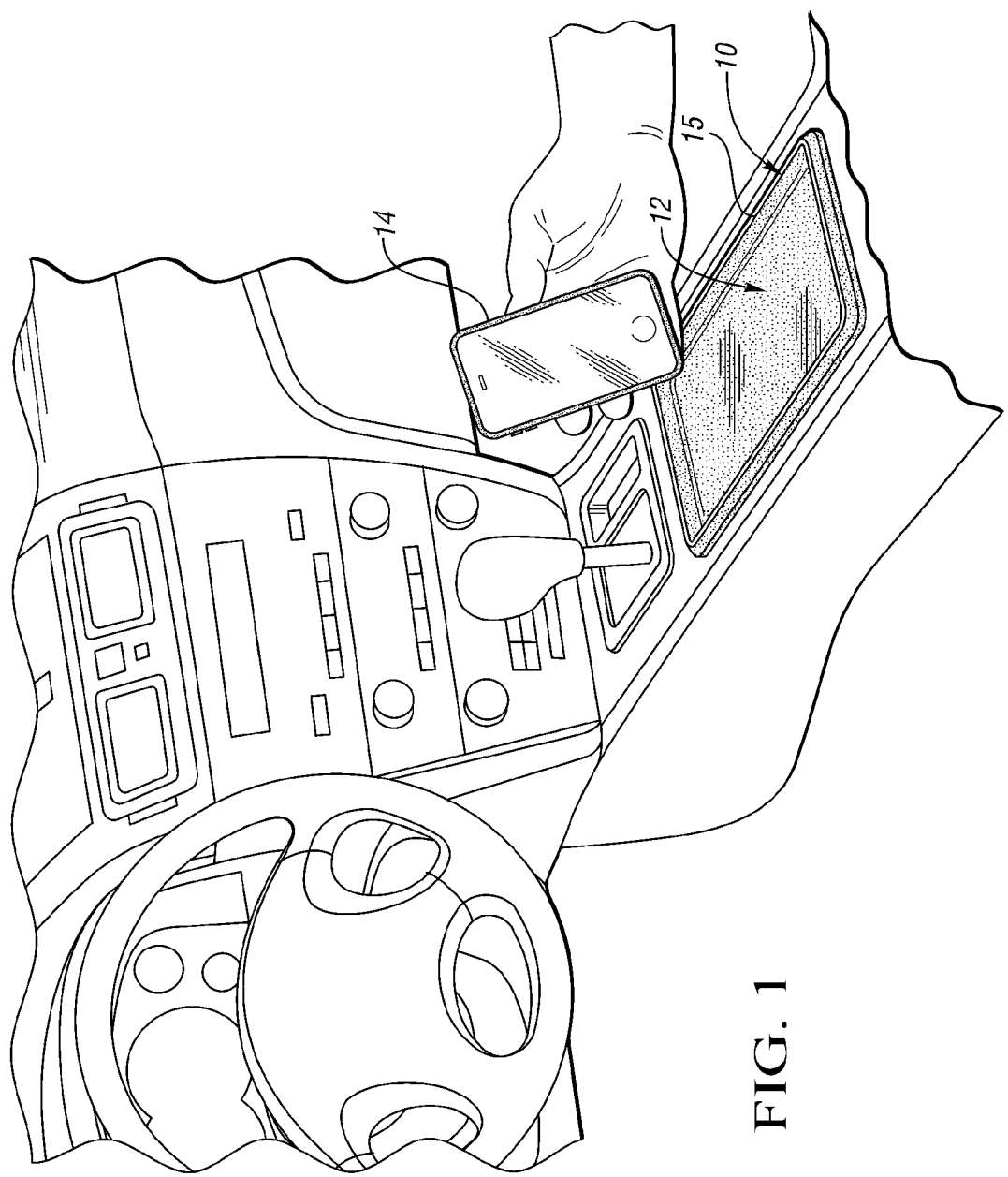
FIG. 1 is an environmental view, partially broken away, of an automotive vehicle interior including a plastic part assembly constructed in accordance with at least one embodiment of the present invention.
Figure 2:
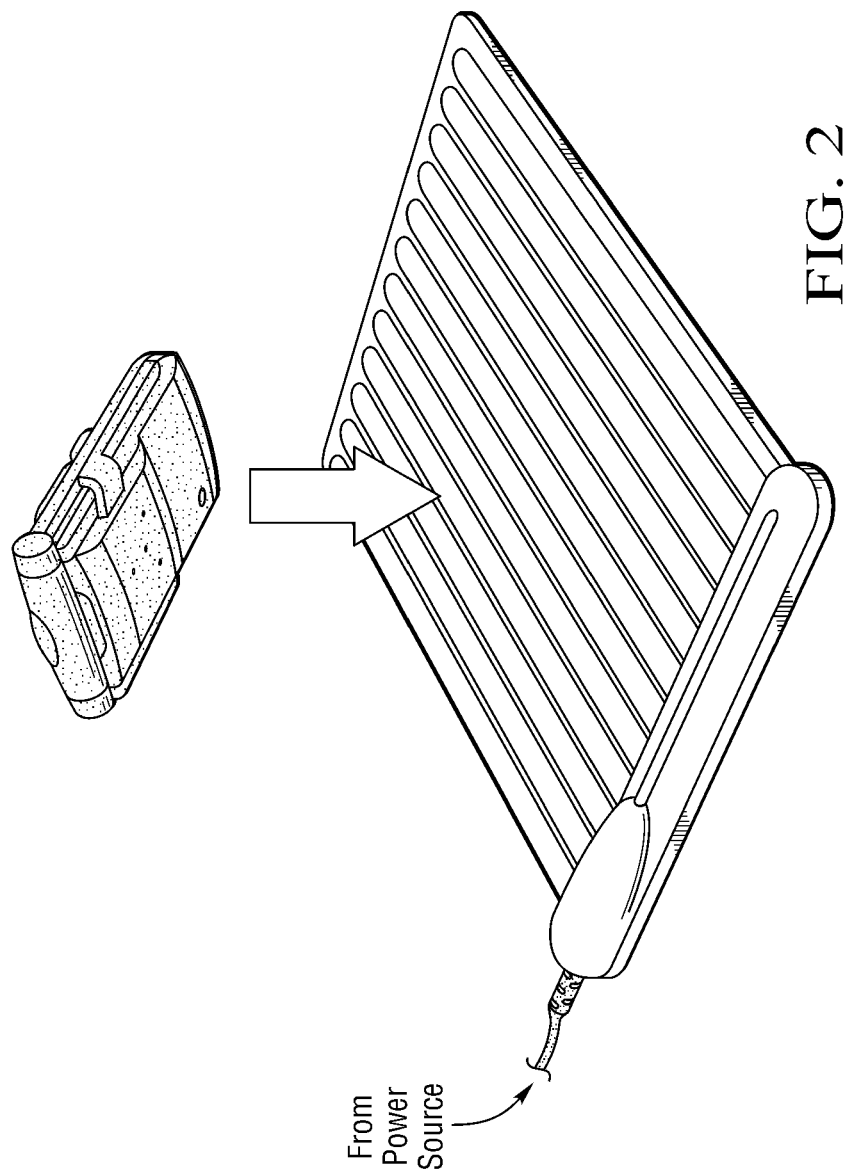
FIG. 2 is a perspective view, partially broken away, of a prior art charging pad, which includes a power delivery support surface, and an electronic device to be charged shown above the power delivery support surface.
Figure 3:
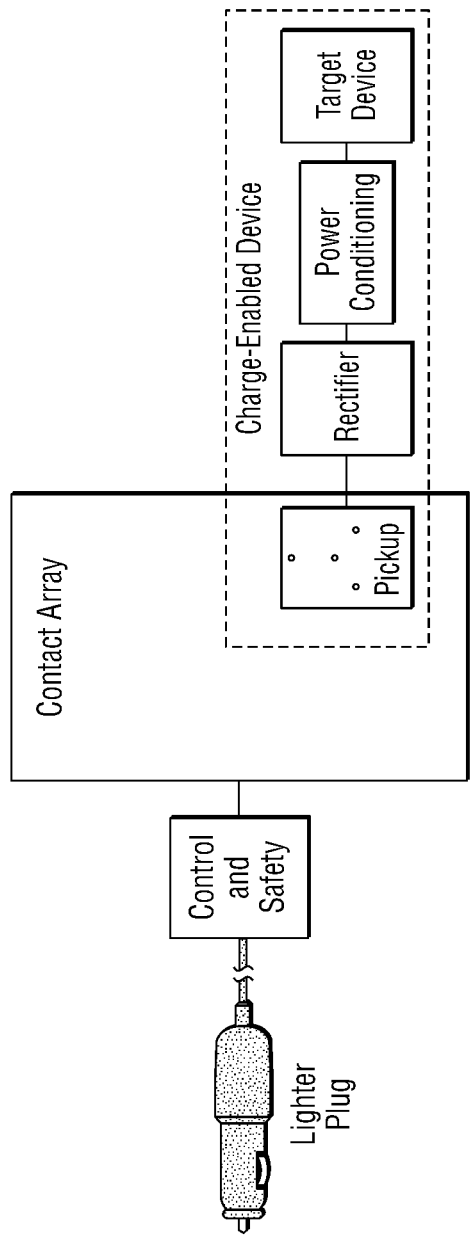
FIG. 3 is a schematic block diagram, partially broken away, of a charging system including a prior art charge-enabled device and further including the contact array of the plastic part assembly of FIG. 1, electrically coupled to a plug such as a lighter plug which can be inserted into an automotive interior DC power outlet to provide electrical power to the support surface of the part assembly.

Referring now to FIG. 1, an automotive vehicle interior plastic part assembly constructed in accordance with at least one embodiment of the present invention is generally indicated at 10. The part assembly 10 includes an anti-vibration and anti-shock support surface, generally indicated at 12, capable of supplying electrical power to an electrically-powered device 14 when the device 14 is supported on the surface 12 and the vehicle is either at rest or in motion. The part assembly 10 may also have an upwardly extending outer peripheral wall portion 15 (only shown in FIG. 1) which is integrally formed with and about the support surface 12.

Referring now to FIGS. 4, 5, 6 and 7 the part assembly 10 includes first and second conductive anti-vibration and anti-shock thermoplastic members, generally indicated at 16 and 18, respectively, that comprise at least part of the support surface 12. The members 16 and 18 are preferably made of at least one plastic such as a conductive thermoplastic elastomer (TPE). However, one or more other types of plastic such as conductive thermoplastic which have anti-vibration and anti-shock properties while allowing the surface 12 to supply or transfer electrical power to supported devices during vehicle motion may be used instead of TPEs.

The first member 16 is preferably formed as a unitary molded part from a conductive thermoplastic composite including an electrically conductive first filler in one or more molding processes or operations. However, it is to be understood that the first member 16 (as well as the second member 18) may be formed in a single injection molded process such as a single, two-shot, injection molding operation.

The first member 16 includes a first base portion 15 (FIG. 7) and a first set of surface portions 17 partially defining the support surface 12 and bonded to the first base portion 15. Each of the first set of surface portions 17 includes particles of the first filler dispersed therein in a concentration sufficient to provide a substantially continuous conductive path in the first members 16.

The second member 18 is also formed as a unitary molded part from a conductive thermoplastic composite including an electrically conductive second filler in one or more molding processes or operations. The second member includes a second base portion 19 (FIG. 7) and a second set of surface portions 21 which partially define the support surface 12 and bonded to the second base portion 15. Each of the second set of surface portions 21 include particles of the second filler dispersed therein in a concentration sufficient to provide a substantially continuous conductive path in the second member 18. The members 16 and 18 have substantially the same shape and size formed from substantially the same conductive thermoplastic composite.

The members 16 and 18 are assembled together so that the first set of surface portions 17 are spaced apart and electrically isolated from the second set of surface portions 21 to allow the first and second sets of surface portions 17 and 21, respectively, to be biased at first and second different voltage levels, respectively, at the same time. The first and second sets of surface portions 17 and 21, respectively, allow wireless power transfer to a portable electronic device supported on the support surface 12. The base portions 15 and 19 may be substantially non-conductive relative to their respective sets of surface portions because during molding the first and second fillers, respectively, tend to migrate towards the outer surfaces of their respective members 16 and 18. Alternatively, the base portions 15 and 19 may be formed in one shot of a two-shot injection molding operation and the respective sets of surface portions can be formed in the second of the two-shot process.

Figure 7:
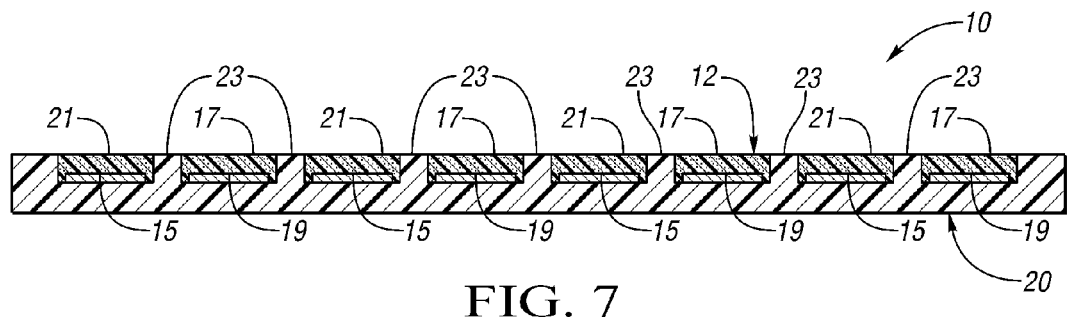
FIG. 7 is a sectional view of a plastic part assembly constructed in accordance with at least one other embodiment of the present invention.

The part assembly 10 also preferably includes a non-conductive or insulating unitary, anti-vibration and anti-shock plastic member, generally indicated at 20, bonded to the first and second members 16 and 18, respectively, and may comprise a part of the anti-vibration and anti-shock support surface 12 as shown in FIG. 7. The member 20 includes a plurality of interconnected, non-conductive or insulating strip portions 23. The portions 23 of the member 20 electrically insulate the first set of surface portions 17 from the second set of surface portions 21 and are preferably made of a non-conductive thermoplastic elastomer (TPE). However, other types of non-conductive thermoplastic having anti-vibration and anti-shock properties may be used.

Figure 4:
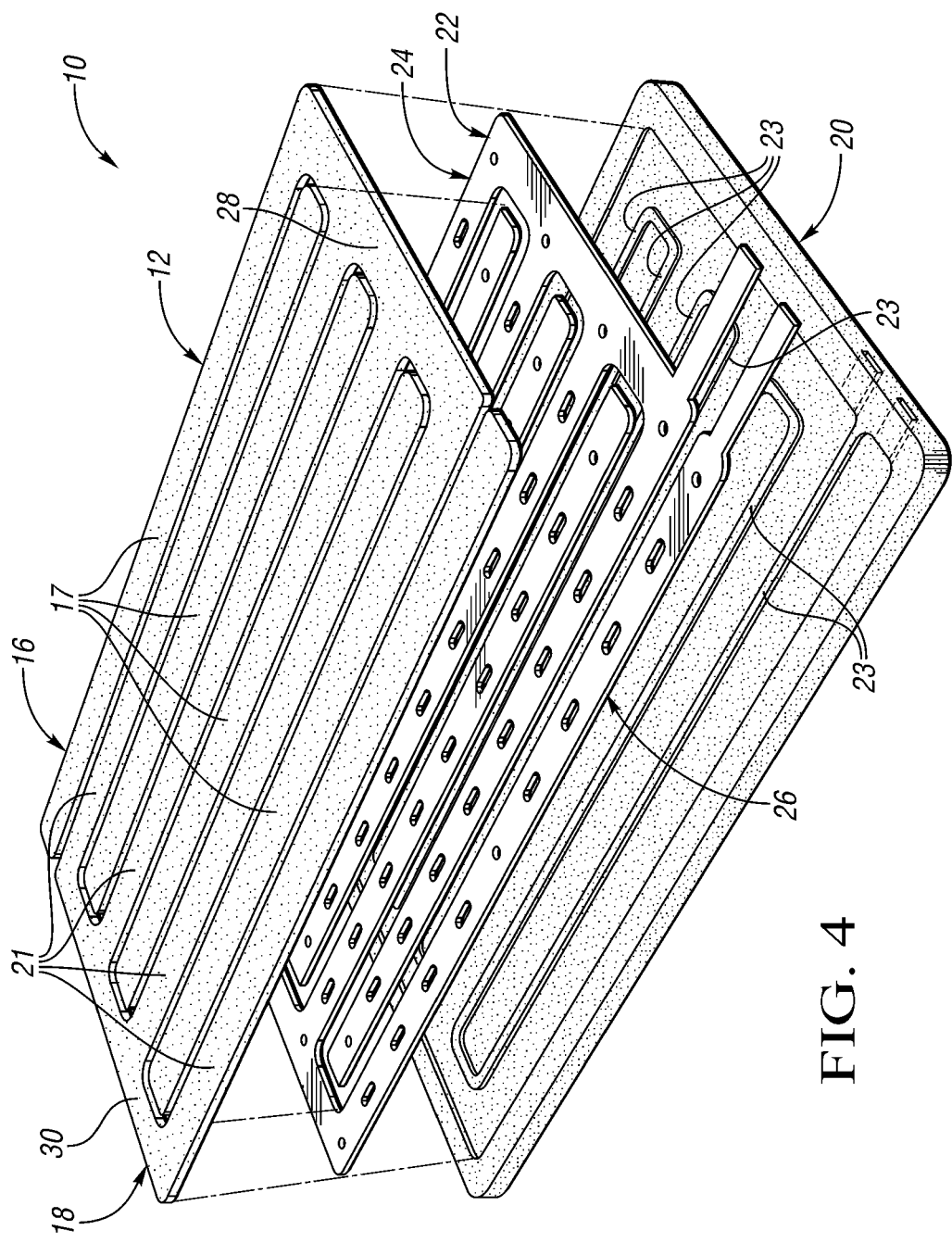
FIG. 4 is an exploded perspective view of a plastic part assembly constructed in accordance with at least one embodiment of the present invention.
Figure 5:
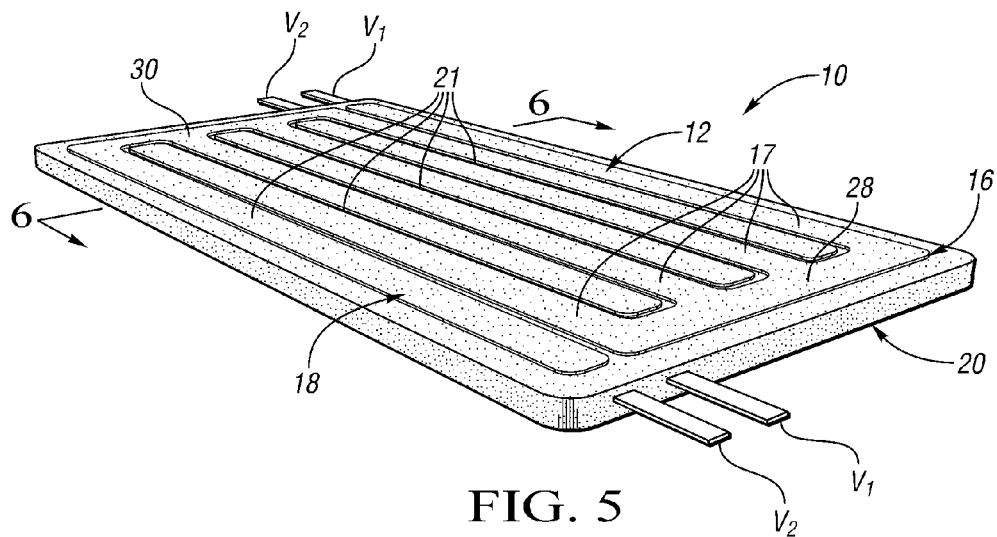
FIG. 5 is a perspective view of the assembly of FIG. 4.
Figure 6:
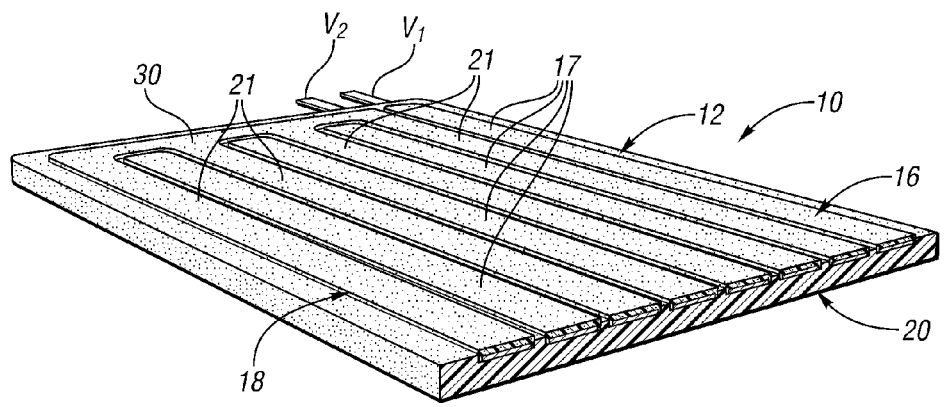
FIG. 6 is a perspective sectional view of the assembly of FIGS. 4 and 5 taken along lines 6-6 of FIG. 5.

The part assembly 10 also includes a power source coupling, generally indicated at 22 in FIG. 4, including first and second conductive power members 24 and 26, respectively. The first member 24 is electrically coupled to each of the first set of surface portions 17 and the second member 26 is electrically coupled to each of the second set of surface portions 21. The first and second members 24 and 26, respectively, form separate conductive pathways and are operable for biasing the first and second sets of surface portions 17 and 21, respectively, at first and second voltage levels, respectively. The first voltage level may be a positive voltage level and the second voltage level may be a positive voltage level less than the first voltage level, a ground voltage level, or a negative voltage level.

The first and second sets of surface portions 17 and 21, respectively, are sized, shaped and arranged laterally adjacent to each other in a pattern at the support surface 12 in relation to a predetermined distribution of contacts of the device 14 to achieve conductive power transfer to the device 14 at various positions and orientations of the device 14 when supported on the support surface 12 while the vehicle is at rest or in motion.

The first set of surface portions 17 includes a first common conductive spine (i.e., TPE) portion 28 (FIG. 4) for coupling the rest of the first set of surface portions 17 together. The first member is comb-shaped. The second set of surface portions 21 also includes a second common conductive spine (i.e., TPE) portion 30 (FIG. 4) for coupling the rest of the second set of surface portions 21 together. The second member 18 is also comb-shaped.

The first common spine portion 28 together with the rest of the first set of surface portions 17 form a first integral, unitary, conductive structure and the second common spine portion 30 together with the rest of the second set of surface portions 21 form a second integral, unitary, conductive structure. The first and second conductive structures are substantially identical as shown in FIG. 4. Also, as shown in FIG. 4, the first set of surface portions 17 comprise finger portions which are interdigitated with the second set of surface portions 21 which also comprise finger portions.

The first and second conductive power members 24 and 26, respectively, are substantially identical in plan view to their respective surface portions 17 and 21, respectively, since they preferably completely cover the bottom surfaces of their respective surface portions 17 and 21. Consequently, the first conductive power member 24 includes a first set of finger portions, and the second conductive power member 26 includes a second set of finger portions which are interdigitated with the first set of finger portions of the first conductive power member 24.

Thermoplastic elastomers (TPEs) are a class of polymers that behave like thermoset rubber but that, above their melt or softening temperatures, are melt processable via thermoplastic processing methods and can be easily reprocessed and remolded. The ability to process these materials with thermoplastic methods allows for design and fabrication freedom.

Bondable thermoplastic elastomer compounds may be formulated to provide a chemical bond to plastic substrates, such as TPE substrates, making possible simpler part designs that are less dependent on mechanical interlocks or require time consuming surface preparation during production.

These compounds are compatible with insert or multi-shot molding methods and are ideal for applications where a "soft-touch" feature can provide an ergonomic touch or enhance consumer appeal, dampen sound or vibration, or provide impact or shock protection. Also, such compounds are elastic.

A thermoplastic elastomer (TPE) of at least one embodiment of the present invention may be selected from the group consisting of a thermoplastic polyolefin, thermoplastic urethane, polyester, polycarbonate, acrylonitrile/butadiene/styrene ("ABS"), polypropylene, lomod, bexloy, mixture of acrylonitrile/butadiene/styrene (i.e., ABS) and polycarbonate, and mixtures thereof.

Conductive plastic compounds such as TPEs of at least one embodiment of the present invention have a number of advantages over metals or surfactant coatings. Finished parts are lighter in weight, easier to handle, and less costly to ship. Their fabrication is usually easier and less expensive due to the elimination of secondary processes, and they are not subject to denting, chipping and scratching.

Conductive compounds can be colored for aesthetic purposes, eliminating the need for secondary color processes, such as painting.

The conductive loaded resin-based material of at least one embodiment of the present invention may include micron conductive powder(s), conductive fiber(s), or a combination of conductive powder and conductive fibers in a base resin host. The percentage by weight of the conductive powder(s), conductive fiber(s), carbon nanotubes, or a combination thereof may be between about 20% and 50% of the weight of the conductive loaded resin-based material. The micron conductive powders may be formed with non-metals, such as carbon, carbon black, graphite, that may also be metallic plated, or the like, or from metals such as stainless steel, nickel, copper, silver, that may also be metallic plates, or the like, or from a combination of non-metal, plated, or in combination with, metal powders. The micron conductor fibers preferably are of nickel-plated carbon or graphite fiber, stainless steel fiber, copper fiber, silver fiber, aluminum fiber, or the like.

Figure 8:
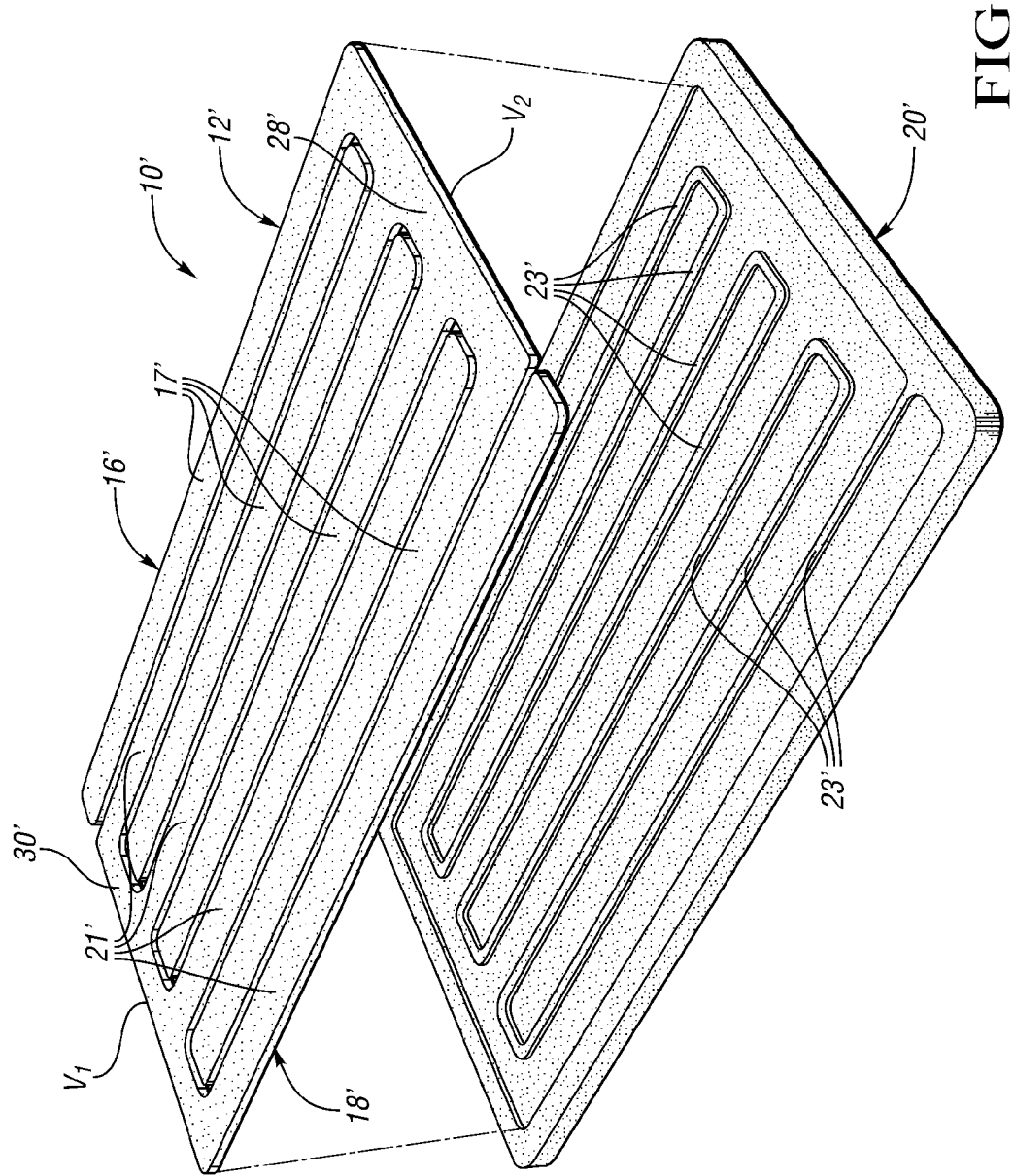
FIG. 8 is an exploded perspective view of a plastic part assembly constructed in accordance with at least one other embodiment of the present invention.
Figure 9:
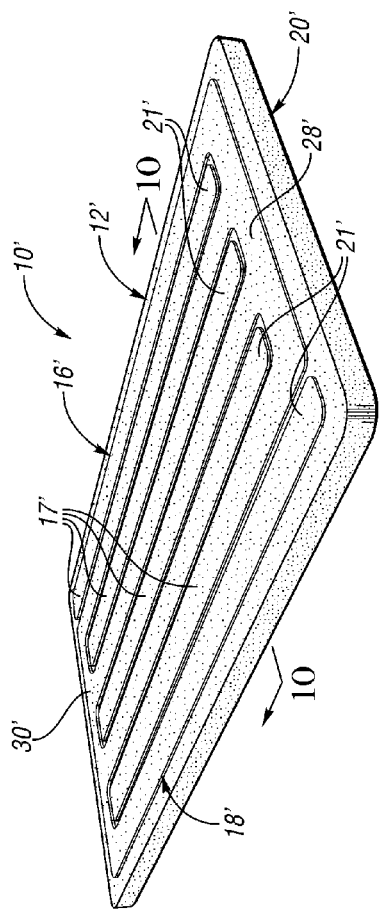
FIG. 9 is a perspective view of the assembly of FIG. 8.
Figure 10:
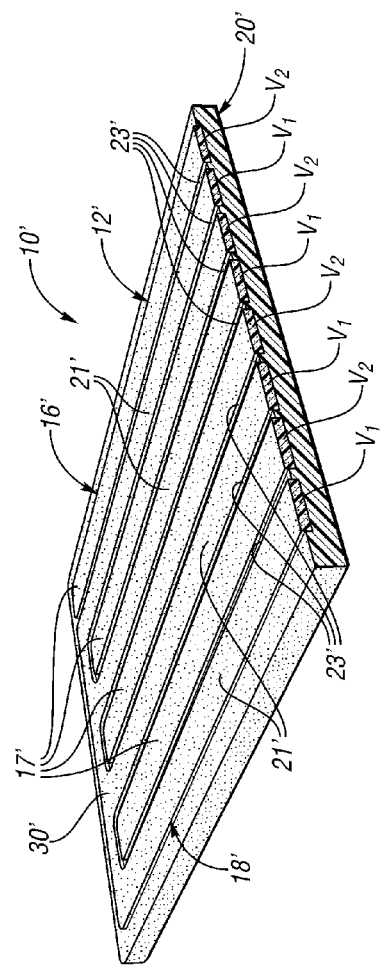
FIG. 10 is a perspective sectional view of the assembly of FIGS. 8 and 9 taken along lines 10-10 of FIG. 9.

FIGS. 8-10 illustrate yet another embodiment of a part assembly, generally indicated at 10', of the present invention. Parts or portions of the assembly 10' which are the same or similar to the part assembly 10 have the same reference number but a single prime designation. The assembly 10' is substantially identical to the assembly 10 but does not require a power source coupling such as the power source coupling 22 because the fillers in the members 16' and 18' have a sufficiently high concentration to eliminate the need for a power source coupling. Power may be provided to the members 16' and 18' in any number of a variety of ways. For example, a number of point contacts (not shown) can be provided at the lower surface of each of the members 16' and 18' and holes can be formed through the member 20' to allow leads to be coupled to the point contacts. Another example is that the respective surface portions of each of the members 16' and 18' may include structural features such as integrally formed, electrically conductive plastic tabs to provide electrical power.

While exemplary embodiments are described above, it is not intended that these embodiments describe all possible forms of the invention. Rather, the words used in the specification are words of description rather than limitation, and it is understood that various changes may be made without departing from the spirit and scope of the invention. Additionally, the features of various implementing embodiments may be combined to form further embodiments of the invention.

What is claimed is:

1. An assembly having a support surface capable of simultaneously supporting and wirelessly supplying electrical power to a portable electronic device supported on the support surface, the assembly comprising:
 a first member formed as a unitary molded part from at least one plastic formulated with an electrically conductive first filler in a molding process, the first member including a first base portion and a first set of surface portions partially defining the support surface and bonded to the first base portion, each of the first set of surface portions including particles of the first filler dispersed therein in a concentration sufficient to provide a substantially continuous conductive path in the first member; and a second member formed as a unitary molded part from at least one plastic formulated with an electrically conductive second filler in a molding process, the second member including a second base portion and a second set of surface portions partially defining the support surface and bonded with the second base portion, each of the second set of surface portions including particles of the second filler dispersed therein in a concentration sufficient to provide a substantially continuous conductive path in the second member;

wherein the members are assembled together so that the first set of surface portions are spaced apart and electrically isolated from the second set of surface portions to allow the first and second sets of surface portions to be biased at first and second different voltage levels, respectively, at the same time and wherein the first and second sets of surface portions allow wireless power transfer to a portable electronic device supported on the support surface.

2. The assembly as claimed in claim 1, further comprising a third member formed as a unitary molded part from an insulating material in a molding process, the third member being positioned between and electrically insulating the first and second sets of surface portions from each other.

3. The assembly as claimed in claim 2, wherein the insulating material is a thermoplastic.

4. The assembly as claimed in claim 2, wherein the third member partially defines the support surface.

5. The assembly as claimed in claim 2, further comprising a power source coupling located between the first and second members and the third member, the coupling including a first conductive power member electrically coupled to each of the first set of surface portions and a second conductive power member electrically coupled to each of the second set of surface portions, the first and second conductive power members forming respective conductive pathways and being operable for biasing the first and second sets of surface portions at the first and second voltage levels, respectively.

6. The assembly as claimed 5, wherein each of the power members comprises a planar interdigitated electrode and wherein the assembly has a sandwich structure.

7. The assembly as claimed in claim 1, wherein the first and second sets of surface portions are sized, shaped and arranged laterally adjacent to each other in a pattern at the support surface in relation to a predetermined distribution of contacts on the device to achieve wireless conductive power transfer to the device in various positions and orientations of the device when supported on the support surface.

8. The assembly as claimed in claim 1, wherein the first set of surface portions include a common spine portion for electrically coupling the rest of the first set of surface portions together.

9. The assembly as claimed in claim 8, wherein the first member is comb-shaped.

10. The assembly as claimed in claim 8, wherein the second set of surface portions includes a common spine portion for electrically coupling the rest of the second set of surface portions together.

11. The assembly as claimed in claim 10, wherein the second member is comb-shaped.

12. The assembly as claimed in claim 11, wherein the members are substantially co-planar.

13. The assembly as claimed in claim 1, wherein the first set of surface portions includes a first plurality of finger portions and the second set of surface portions includes a second plurality of finger portions and wherein the first and second plurality of finger portions are interdigitated.

14. The assembly as claimed in claim 1, wherein the first and second sets of surface portions are anti-vibration and anti-shock surface portions which dampen vibration and shock at the support surface.

15. The assembly as claimed in claim 4, wherein the first and second sets of surface portions are anti-vibration and anti-shock surface portions and the third member includes anti-vibration and anti-shock surface portions to dampen shock and vibration at the support surface.

16. The assembly as claimed in claim 1, wherein the base portions are electrically non-conductive relative to their respective sets of surface portions.

17. The assembly as claimed in claim 1, wherein the members have substantially the same size and shape.

18. The assembly as claimed in claim 1, wherein the members are formed from substantially the same plastic and wherein each molding process is a single injection-molding process.

19. An assembly having a support surface capable of simultaneously supporting and wirelessly supplying electrical power to a portable electronic device supported on the support surface within the interior of a vehicle, the assembly comprising:

a first member formed as a unitary molded part from at least one plastic formulated with an electrically conductive first filler in a molding process, the first member including a first base portion and a first set of surface portions partially defining the support surface and bonded to the first base portion, each of the first set of surface portions including particles of the first filler dispersed therein in a concentration sufficient to provide a substantially continuous conductive path in the first member; and a second member formed as a unitary molded part from at least one plastic formulated with an electrically conductive second filler in a molding process, the second member including a second base portion and a second set of surface portions partially defining the support surface and bonded with the second base portion, each of the second set of surface portions including particles of the second filler dispersed therein in a concentration sufficient to provide a substantially continuous conductive path in the second member;

wherein the members are assembled together so that the first set of surface portions are spaced apart and electrically isolated from the second set of surface portions to allow the first and second sets of surface portions to be biased at first and second different voltage levels, respectively, at the same time and wherein the first and second sets of surface portions allow wireless power transfer to a portable electronic device supported on the support surface.

20. An assembly having a support surface capable of simultaneously supporting and wirelessly supplying electrical power to a portable electronic device supported on the support surface within the interior of an automotive vehicle, the assembly comprising:

a first member formed as a unitary molded part from at least one plastic formulated with an electrically conductive first filler in a molding process, the first member including a first base portion and a first set of surface portions partially defining the support surface and bonded with the first base portion, each of the first set of surface portions including particles of the first filler dispersed therein in a concentration sufficient to provide a substantially continuous conductive path in the first member; and a second member formed as a unitary molded part from at least one plastic formulated with an electrically conductive second filler in a molding process, the second member including a second base portion and a second set of surface portions partially defining the support surface and bonded with the second base portion, each of the second set of surface portions including particles of the second filler dispersed therein in a concentration sufficient to provide a substantially continuous conductive path in the second member;

wherein the members are assembled together so that the first set of surface portions are spaced apart and electrically isolated from the second set of surface portions to allow the first and second sets of surface portions to be biased at first and second different voltage levels, respectively, at the same time and wherein the first and second sets of surface portions allow wireless power transfer to a portable electronic device supported on the support surface.

\* \* \* \* \*